(12) United States Patent
Li

(10) Patent No.: US 11,984,073 B2
(45) Date of Patent: May 14, 2024

(54) PARTITIONED DISPLAY STRUCTURE, DISPLAY PANEL, AND ORGANIC LIGHT-EMITTING DIODE DISPLAY PANEL

(71) Applicant: TCL CHINA STAR OPTOELECTRONICS TECHNOLOGY CO., LTD., Guangdong (CN)

(72) Inventor: Yan Li, Guangdong (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 781 days.

(21) Appl. No.: 16/972,038

(22) PCT Filed: Oct. 28, 2020

(86) PCT No.: PCT/CN2020/124503
§ 371 (c)(1),
(2) Date: Dec. 4, 2020

(87) PCT Pub. No.: WO2022/067932
PCT Pub. Date: Apr. 7, 2022

(65) Prior Publication Data
US 2022/0102475 A1 Mar. 31, 2022

(30) Foreign Application Priority Data
Sep. 29, 2020 (CN) .......................... 202011045974.3

(51) Int. Cl.
*G09G 3/3233* (2016.01)
*G09G 3/3258* (2016.01)

(52) U.S. Cl.
CPC ......... *G09G 3/3233* (2013.01); *G09G 3/3258* (2013.01); *G09G 2320/0204* (2013.01); *G09G 2320/0233* (2013.01)

(58) Field of Classification Search
None
See application file for complete search history.

(56) References Cited

U.S. PATENT DOCUMENTS

| 2003/0107560 A1* | 6/2003 | Yumoto | ................... G09G 3/30 345/204 |
| 2006/0061008 A1* | 3/2006 | Karner | ..................... G06T 7/70 264/250 |

(Continued)

FOREIGN PATENT DOCUMENTS

| CN | 103688302 A | 3/2014 |
| CN | 104867454 A | 8/2015 |

(Continued)

*Primary Examiner* — Dorothy Harris
(74) *Attorney, Agent, or Firm* — The Roy Gross Law Firm, LLC; Roy Gross

(57) ABSTRACT

A partitioned display structure includes a plurality of direct current (DC) voltage electrodes, each of the DC voltage electrodes is connected to a plurality of light-emitting units; a plurality of input voltage sources, the input voltage sources are connected to the DC voltage electrodes in a one-to-one manner, and are configured to transmit input signals to the plurality of light-emitting units for emitting light for displaying images; and a plurality of switches. Each of the switches is connected between two adjacent DC voltage electrodes to control a connection between the two adjacent DC voltage electrodes, the plurality of DC voltage electrodes are connected with each other in response to the plurality of switches in a turned-on state, and the plurality of DC voltage electrodes are insulated from each other in response to the plurality of switches in a turned-off state.

20 Claims, 2 Drawing Sheets

(56) References Cited

U.S. PATENT DOCUMENTS

| | | | |
|---|---|---|---|
| 2009/0128571 A1* | 5/2009 | Smith | G09G 3/3216 345/519 |
| 2010/0177086 A1* | 7/2010 | Nakamura | G09G 3/3258 345/76 |
| 2011/0043435 A1* | 2/2011 | Hebenstreit | G09G 3/34 345/204 |
| 2011/0115830 A1 | 5/2011 | Lee | |
| 2011/0298782 A1* | 12/2011 | Park | G09G 3/3225 345/212 |
| 2014/0111567 A1* | 4/2014 | Nathan | G09G 3/3233 345/694 |
| 2015/0279322 A1* | 10/2015 | Douglas | G09G 3/3208 345/82 |
| 2016/0379561 A1 | 12/2016 | Jin et al. | |
| 2017/0193899 A1* | 7/2017 | Yoon | G09G 3/3233 |
| 2017/0299907 A1* | 10/2017 | Zhao | H01L 27/124 |
| 2019/0088707 A1* | 3/2019 | Do | H01L 33/60 |
| 2020/0335039 A1 | 10/2020 | Azizi et al. | |
| 2021/0142764 A1 | 5/2021 | Gao et al. | |

FOREIGN PATENT DOCUMENTS

| | | |
|---|---|---|
| CN | 105278194 A | 1/2016 |
| CN | 205139542 U | 1/2016 |
| CN | 107887421 A | 4/2018 |
| CN | 108550347 A | 9/2018 |
| CN | 109686308 A | 4/2019 |
| CN | 109713022 A | 5/2019 |
| CN | 209281853 U | 8/2019 |
| CN | 110249430 A | 9/2019 |
| CN | 111653230 A | 9/2020 |
| KR | 20110039006 A | 4/2011 |

* cited by examiner

PARTITIONED DISPLAY STRUCTURE, DISPLAY PANEL, AND ORGANIC LIGHT-EMITTING DIODE DISPLAY PANEL

BACKGROUND

Field of Invention

The present application relates to a display technology field, and more particularly to a partitioned display panel, a display panel, and an organic light-emitting diode display panel.

With development of display technology, users' requirements for fineness of display images have been gradually increasing. When an input voltage source transmits an input signal to an entire direct current (DC) voltage electrode of a display panel, a voltage of the input signal will decrease as transmission distance increases, resulting in a difference in voltages received by light-emitting units that is powered by the DC voltage electrode, which affects performance of the display panel in brightness uniformity. Furthermore, because a brightness of a display image is comprehensively adjusted through a display structure (including the entire DC voltage electrode) of an existing display panel, the brightness of the display image cannot be adjusted in more detail. It can be seen that the existing display structure can no longer meet market's requirements for image fineness. Therefore, it is necessary to provide a partitioned display structure, a display panel, and an organic light-emitting diode display panel to solve problems in the prior art.

SUMMARY

An objective of the present invention is to provide a partitioned display structure, a display panel, and an organic light-emitting diode display panel to solve problems in the prior art.

In order to achieve the above objective, a first aspect of the present invention provides a partitioned display structure, comprising:

a plurality of direct current (DC) voltage electrodes, wherein each of the DC voltage electrodes is connected to a plurality of light-emitting units;

a plurality of input voltage sources, wherein the input voltage sources are connected to the DC voltage electrodes in a one-to-one manner, and are configured to transmit input signals to the plurality of light-emitting units for emitting light for displaying images; and a plurality of switches, wherein each of the switches is connected between two adjacent DC voltage electrodes to control a connection between the two adjacent DC voltage electrodes, the plurality of DC voltage electrodes are connected with each other in response to the plurality of switches in a turned-on state, and the plurality of DC voltage electrodes are insulated from each other in response to the plurality of switches in a turned-off state.

Further, in response to the plurality of switches in the turned-on state, the light-emitting units disposed on the DC voltage electrodes emit light for displaying images according to the same input signals, and in response to the plurality of switches in the turned-off state, the light-emitting units disposed on each of the DC voltage electrodes emit light for displaying images according to the input signals inputted from the input voltage source correspondingly connected to the DC voltage electrode.

Further, each of the switches is a thin-film transistor, a source terminal and a drain terminal of the thin-film transistor are connected between the two adjacent DC voltage electrodes, respectively, a gate terminal of the thin-film transistor receives an enable signal, and the enable signal is configured to control each of the switches to be in the turned-on state or the turned-off state.

Further, in response to the enable signal being a high-level signal, the plurality of switches are in the turned-on state, and in response to the enable signal being a low-level signal, the plurality of switches are in the turned-off state.

Further, a brightness of an image outputted using a second voltage as voltages of the input signals is higher than a brightness of an image outputted using a first voltage as the voltages of the input signals, and wherein the second voltage is greater than the first voltage.

Further, each of the light-emitting units comprises:

a light-emitting component, wherein a first terminal of the light-emitting component is connected to the DC voltage electrode correspondingly connected to the light-emitting component;

a first switch, wherein a first terminal of the first switch is connected to a second terminal of the light-emitting component, and a third terminal of the first switch is grounded;

a second switch, wherein a first terminal of the second switch is connected to a data line, a second terminal of the second switch is connected to a scan line, and a third terminal of the second switch is connected to a second terminal of the first switch; and a storage capacitor, wherein a first terminal of the storage capacitor is connected to the second terminal of the first switch and the third terminal of the second switch, and a second terminal of the storage capacitor is grounded.

Further, the light-emitting component is an organic light-emitting diode.

Further, the first switch and the second switch are thin-film transistors.

A second aspect of the present invention provides a display panel, comprising a partitioned display structure, wherein the partitioned display structure comprises:

a plurality of direct current (DC) voltage electrodes, wherein each of the DC voltage electrodes is connected to a plurality of light-emitting units;

a plurality of input voltage sources, wherein the input voltage sources are connected to the DC voltage electrodes in a one-to-one manner, and are configured to transmit input signals to the plurality of light-emitting units for emitting light for displaying images; and a plurality of switches, wherein each of the switches is connected between two adjacent DC voltage electrodes to control a connection between the two adjacent DC voltage electrodes, the plurality of DC voltage electrodes are connected with each other in response to the plurality of switches in a turned-on state, and the plurality of DC voltage electrodes are insulated from each other in response to the plurality of switches in a turned-off state.

Further, in response to the plurality of switches in the turned-on state, the light-emitting units disposed on the DC voltage electrodes emit light for displaying images according to the same input signals, and in response to the plurality of switches in the turned-off state, the light-emitting units disposed on each of the DC voltage electrodes emit light for displaying images according to the input signals inputted from the input voltage source correspondingly connected to the DC voltage electrode.

Further, each of the switches is a thin-film transistor, a source terminal and a drain terminal of the thin-film transistor are connected between the two adjacent DC voltage electrodes, respectively, a gate terminal of the thin-film transistor receives an enable signal, and the enable signal is configured to control each of the switches to be in the turned-on state or the turned-off state.

Further, in response to the enable signal being a high-level signal, the plurality of switches are in the turned-on state, and in response to the enable signal being a low-level signal, the plurality of switches are in the turned-off state.

Further, a brightness of an image outputted using a second voltage as voltages of the input signals is higher than a brightness of an image outputted using a first voltage as the voltages of the input signals, and wherein the second voltage is greater than the first voltage.

Further, each of the light-emitting units comprises:
- a light-emitting component, wherein a first terminal of the light-emitting component is connected to the DC voltage electrode correspondingly connected to the light-emitting component;
- a first switch, wherein a first terminal of the first switch is connected to a second terminal of the light-emitting component, and a third terminal of the first switch is grounded;
- a second switch, wherein a first terminal of the second switch is connected to a data line, a second terminal of the second switch is connected to a scan line, and a third terminal of the second switch is connected to a second terminal of the first switch; and
- a storage capacitor, wherein a first terminal of the storage capacitor is connected to the second terminal of the first switch and the third terminal of the second switch, and a second terminal of the storage capacitor is grounded.

Further, the light-emitting component is an organic light-emitting diode.

Further, the first switch and the second switch are thin-film transistors.

A third aspect of the present invention provides an organic light-emitting diode display panel, comprising a partitioned display structure, wherein the partitioned display structure comprises:
- a plurality of direct current (DC) voltage electrodes, wherein each of the DC voltage electrodes is connected to a plurality of light-emitting units;
- a plurality of input voltage sources, wherein the input voltage sources are connected to the DC voltage electrodes in a one-to-one manner, and are configured to transmit input signals to the plurality of light-emitting units for emitting light for displaying images; and
- a plurality of switches, wherein each of the switches is connected between two adjacent DC voltage electrodes to control a connection between the two adjacent DC voltage electrodes, the plurality of DC voltage electrodes are connected with each other in response to the plurality of switches in a turned-on state, and the plurality of DC voltage electrodes are insulated from each other in response to the plurality of switches in a turned-off state.

Further, in response to the plurality of switches in the turned-on state, the light-emitting units disposed on the DC voltage electrodes emit light for displaying images according to the same input signals, and in response to the plurality of switches in the turned-off state, the light-emitting units disposed on each of the DC voltage electrodes emit light for displaying images according to the input signals inputted from the input voltage source correspondingly connected to the DC voltage electrode.

Further, each of the switches is a thin-film transistor, a source terminal and a drain terminal of the thin-film transistor are connected between the two adjacent DC voltage electrodes, respectively, a gate terminal of thin-film transistor receives an enable signal, and the enable signal is configured to control each of the switches to be in the turned-on state or the turned-off state.

Further, a brightness of an image outputted using a second voltage as voltages of the input signals is higher than a brightness of an image outputted using a first voltage as the voltages of the input signals, and wherein the second voltage is greater than the first voltage.

Beneficial Effect

In the present invention, input voltage sources are connected to a plurality of direct current (DC) voltage electrodes, each of the DC voltage electrodes 10 occupies a small area, in the one-to-one manner, and a plurality of switches are disposed between the plurality of DC voltage sources. Therefore, in response to the plurality of switches 20 being in the turned-on state, because the DC voltage electrodes 10 receive the same input signals, and because voltages of the input signals are not prone to decrease as transmission distance increases, the voltages of the input signals Vs on different DC voltage electrodes 10 can tend to be consistent when the plurality of DC voltage electrodes 10 are connected with each other, to make voltages of the input signals Vs received by the light-emitting units M are further the same, and each of the light-emitting components M may emit light with the same brightness, a problem of uneven brightness of a display panel can be improved. Further, in response to the plurality of switches 20 being in the turned-off state, light-emitting brightness of the light-emitting components disposed on different DC voltage electrodes 10 may be independently controlled by the input voltage sources to locally adjust brightness, thereby obtaining an image with higher contrast compared with an image obtained by an existing display structure.

DETAILED DESCRIPTION OF EMBODIMENTS

To make the objectives, technical schemes, and effects of the present invention clearer and more specific, the present invention is described in further detail below with reference to appending drawings. It should be understood that specific embodiments described herein are merely for explaining the present invention, and it is not used to limit the present invention.

Figure 1:
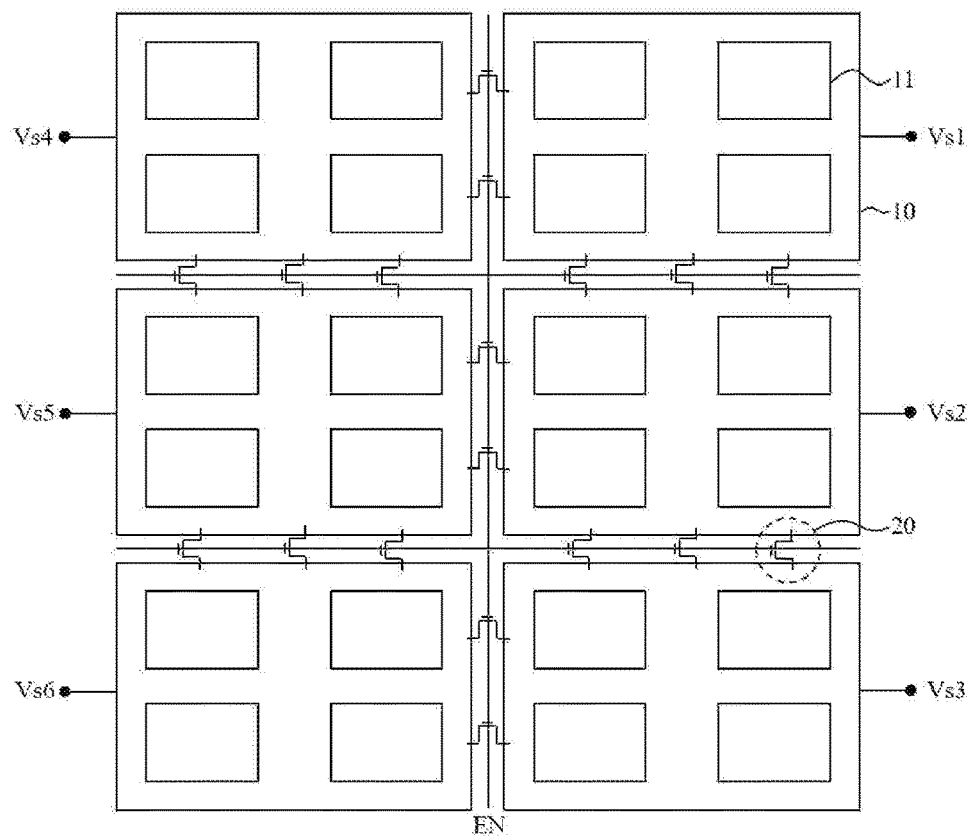
FIG. 1 is a schematic diagram showing a partitioned display structure according to an embodiment of the present application.

Referring to FIG. 1, which is a schematic diagram showing a partitioned display structure according to an embodiment of the present application. The partitioned display structure is applied to a display panel or a display device including the display panel. For example, the partitioned display structure is applied to an organic light-emitting diode display panel or device. The partitioned display structure includes a plurality of direct current (DC) voltage electrodes 10, a plurality of input voltage sources Vs1-Vs6, and a plurality of switches 20. It should be noted that six DC voltage electrodes 10, six input voltage sources Vs1-Vs6, and eighteen switches 20 are used for illustration in FIG. 1. However, the number of each of the components is set only for the sake of explaining the present invention, and it should not be interpreted as a limitation to the present invention. In addition, each of the input voltage sources Vs1/Vs2/Vs3/Vs4/Vs5/Vs6 may also be a voltage input point, and it is not limited to an independent power supply device.

In the present embodiment, each of the DC voltage electrodes 10 is connected to a plurality of light-emitting units 11; the input voltage sources Vs1/Vs2/Vs3/Vs4/Vs5/Vs6 are connected to the DC voltage electrodes 10 in a one-to-one manner, and are configured to transmit input signals (Vs shown in FIG. 2) to the plurality of light-emitting units 11 for emitting light for displaying images; each of the switches 20 is connected between two adjacent DC voltage electrodes 10 to control a connection between the two adjacent DC voltage electrodes 10. That is, the plurality of DC voltage electrodes 10 are connected with each other in response to the plurality of switches 20 in a turned-on state, and the plurality of DC voltage electrodes 10 are insulated from each other in response to the plurality of switches 20 in a turned-off state (it will be explained in detail later). It should be noted that FIG. 1 shows that each of the DC voltage electrodes 10 is connected with four light-emitting units 11 for illustration, but the number of the light-emitting units 11 is set only for the sake of explaining the present invention, and it should not be interpreted as a limitation to the present invention.

Further, each of the switches 20 is a thin-film transistor (TFT), a source terminal and a drain terminal of the thin-film transistor are connected between the two adjacent DC voltage electrodes 10 respectively, a gate terminal of the thin-film transistor receives an enable signal EN, and the enable signal EN is configured to control each of the switches 20 to be in the turned-on state or the turned-off state. In response to the enable signal EN being a high-level signal, the plurality of switches 20 are in the turned-on state, and the plurality of DC voltage electrodes 10 are connected with each other through the plurality of switches 20; in response to the enable signal EN being a low-level signal, the plurality of switches 20 are in the turned-off state, and the plurality of DC voltage electrodes 10 are insulated from each other.

Figure 2:
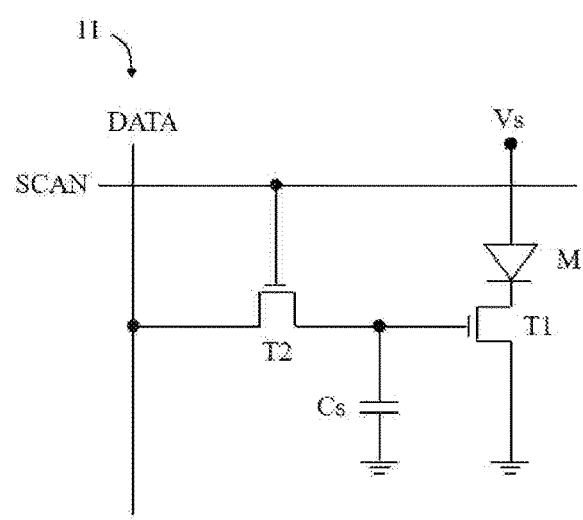
FIG. 2 is a schematic diagram showing a circuit of a light-emitting unit according to an embodiment of the present application.

As shown in FIG. 1 and FIG. 2, FIG. 2 is a schematic diagram showing a circuit of the light-emitting unit 11 according to an embodiment of the present application. Further, each of the light-emitting units 11 includes a light-emitting component M, a first switch T1, a second switch T2, and a storage capacitor Cs. A first terminal of the light-emitting component M is connected to the DC voltage electrode 10 correspondingly connected to the light-emitting component M, and is configured to emit light for displaying images by receiving the input signal Vs transmitted by the DC voltage electrode 10, and a second terminal of the light-emitting component M is connected to a first terminal of the first switch T1; the first terminal of the first switch T1 is connected to the second terminal of the light-emitting component M, a second terminal of the first switch T1 is connected to a third terminal of the second switch T2 and a first terminal of the storage capacitor Cs, and a third terminal of the first switch T1 is grounded; a first terminal of the second switch T2 is connected to a data line DATA, a second terminal of the second switch T2 is connected to a scan line SCAN, and a third terminal of the second switch T2 is connected to the second terminal of the first switch T1 and the first terminal of the storage capacitor Cs; the first terminal of the storage capacitor Cs is connected to the second terminal of the first switch T1 and the third terminal of the second switch T2, and a second terminal of the storage capacitor Cs is grounded. Preferably, the light-emitting component M is an organic light-emitting diode, and the first switch T1 and the second switch T2 are thin-film transistors.

Figure 3A:
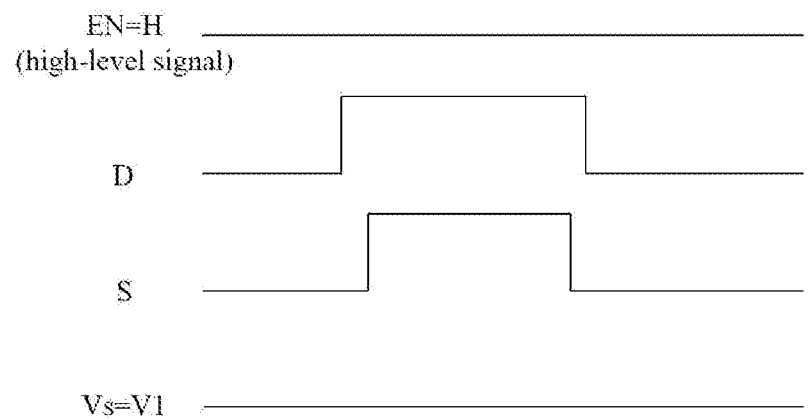
FIG. 3A is a timing sequence chart for a partitioned display structure operated in a case that a plurality of switches are in a turned-on state according to an embodiment of the present application.
Figure 3B:
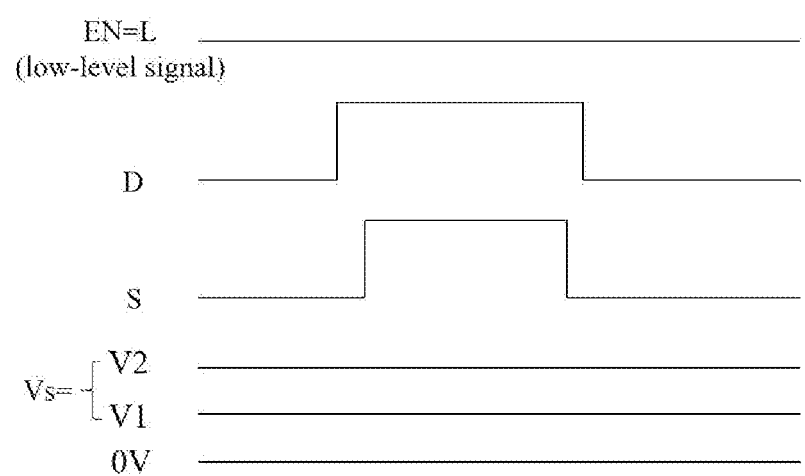
FIG. 3B is a timing sequence chart for a partitioned display structure operated in a case that a plurality of switches are in a turned-off state according to an embodiment of the present application.

As shown in FIG. 1 to FIGS. 3A-3B, FIG. 3A is a timing sequence chart for the partitioned display structure operated in a case that the plurality of switches 20 are in the turned-on state according to an embodiment of the present application, FIG. 3B is a timing sequence chart for the partitioned display structure operated in a case that the plurality of switches 20 are in the turned-off state according to an embodiment of the present application.

In each of the light-emitting units 11, if a data signal D is inputted to the first terminal of the second switch T2, and the second terminal of the second switch T2 receives a scan signal S during the data signal D is inputted, both the first switch T1 and the second switch T2 are turned on, and since the storage capacitor Cs is capable of continuously providing an electrical signal to the second terminal of the second switch T2, the second switch T2 is in a constant turned-on state. When the first terminal of the light-emitting component M receives the input signal Vs transmitted by the corresponding input voltage source Vs1/Vs2/Vs3/Vs4/Vs5/Vs6, the first terminal of the light-emitting component M is at a high potential, the second terminal of the light-emitting component M is at a low potential (grounded), so that the light-emitting component M can be biased as a forward bias to emit light.

In a case that the input voltage sources Vs1/Vs2/Vs3/Vs4/Vs5/Vs6 output the same input signals Vs, the light-emitting units 11 disposed on the DC voltage electrodes 10 emit light for displaying images according to the same input signals. Since each of the input voltage sources Vs1/Vs2/Vs3/Vs4/Vs5/Vs6 only needs to transmit the corresponding input signal Vs to the corresponding DC voltage electrode occupying a small area, voltages of the input signals Vs are not prone to decrease as transmission distance increases, and a voltage received by the light-emitting units 11 disposed on each of the DC voltage electrodes 10 is the same as the voltage of the input signal Vs transmitted by each of the input voltage sources Vs1/Vs2/Vs3/Vs4/Vs5/Vs6, so that each of the light-emitting components M may emit light with the same brightness, and a problem of uneven brightness of a display panel is improved.

In a case that the input voltage sources Vs1/Vs2/Vs3/Vs4/Vs5/Vs6 output the same input signals Vs, as further shown in FIG. 3A, in response to the plurality of switches 20 being in the turned-on state (i.e., the enable signal EN is a high-level signal), the plurality of DC voltage electrodes 10 are connected with each other through the plurality of switches 20, and input signals (i.e., voltage signals) on different DC voltage electrodes 10 are conductive to each other and tend to be consistent, so that voltages of the input signals Vs received by the light-emitting units 11 are further the same. Furthermore, each of the light-emitting components M may emit light with the same light-emitting brightness, brightness uniformity of the display panel is further improved, and performance of the display panel on image fineness is improved.

As shown in FIG. 3B, in response to the plurality of switches 20 being in the turned-off state (i.e., the enable signal EN is a low-level signal), the plurality of DC voltage electrodes 10 are insulated from each other. Different input signals Vs are inputted to the light-emitting units 11 disposed on different DC voltage electrodes 10, thereby independently controlling light-emitting brightness of the light-emitting components M disposed on different DC voltage electrodes 10. That is, the light-emitting units 11 disposed on each of the DC voltage electrodes 10 emit light for displaying images according to the input signal Vs transmitted by the input voltage source Vs1/Vs2/Vs3/Vs4/Vs5/Vs6 correspondingly connected to the light-emitting component M, thereby realizing local adjustment to brightness to obtain an image, such as a high-contrast image. Compared with an existing display structure, a higher-contrast performance can be achieved to meet a display requirement for high-contrast images by adopting the display panel of the present invention.

Further, the higher the voltages of the input signals Vs, the higher brightness of images can be achieved. For example, in FIG. 3B, a second voltage V2 is greater than a first voltage V1; when the input voltage Vs are greater than the second voltage V2, a grayscale image of a higher brightness can be achieved compared with a grayscale image when the input voltage Vs is same as the second voltage V1. When the voltages of the input signals Vs are same as the second voltage V2, it is suitable for displaying high-grayscale or high-brightness images, and when the voltages of the input signals Vs are the first voltage V1, it is suitable for displaying low-grayscale or low-brightness images. The voltages of the input signals Vs can be dynamically changed to the first voltage V1, the second voltage V2 or other voltages to meet display requirements for images with different gray scales or brightnesses, thereby achieving better display performance.

The present invention also provides a display panel (such as an organic light-emitting diode display panel), which includes the above-mentioned partitioned display structure, it will not be repeated here.

In the present invention, the input voltage sources Vs1/Vs2/Vs3/Vs4/Vs5/Vs6 are connected to the plurality of DC voltage electrodes 10, each of the DC voltage electrodes 10 occupies a small area, in the one-to-one manner, and the plurality of switches 20 are disposed between the plurality of DC voltage sources. Therefore, in response to the plurality of switches 20 being in the turned-on state, because the DC voltage electrodes 10 receive the same input signals Vs, and because the voltages of the input signals Vs are not prone to decrease as transmission distance increases, voltages of the input signals Vs on different DC voltage electrodes 10 can tend to be consistent when the plurality of DC voltage electrodes are connected with each other, to make voltages of the input signals Vs received by the light-emitting units M are further the same, and each of the light-emitting components M may emit light with the same brightness. The problem of uneven brightness of a display panel can be improved. Further, in response to the plurality of switches 20 being in the turned-off state, the light-emitting brightness of the light-emitting components M disposed on different DC voltage electrodes 10 may be independently controlled by the input voltage sources Vs1/Vs2/Vs3/Vs4/Vs5/Vs6 to locally adjust brightness, thereby obtaining an image with higher contrast compared with an image obtained by the existing display structure.

Although the present invention has been disclosed above in the preferred embodiments, the above preferred embodiments are not intended to limit the present invention. For persons skilled in this art, various modifications and alterations can be made without departing from the spirit and scope of the present application. The protective scope of the present application is subject to the scope as defined in the claims.

What is claimed is:

1. A partitioned display structure, comprising:
   a plurality of direct current (DC) voltage electrodes, disposed spaced apart and arranged in an array with at least two rows and two columns, wherein each of the DC voltage electrodes is connected to a plurality of light-emitting units on the DC voltage electrode;
   a plurality of input voltage sources, wherein the input voltage sources are connected to the DC voltage electrodes respectively in a one-to-one manner and are configured to transmit input signals to the plurality of light-emitting units for emitting light for displaying images, and each input voltage source transmits the input signals exclusively to a respective corresponding one of the DC voltage electrodes; and
   a plurality of switches, wherein each of the switches is connected between two adjacent DC voltage electrodes;
   wherein when the plurality of switches are in a turned-on state, the input signals output by the plurality of input voltage sources output are same signals and have a same voltage, the plurality of DC voltage electrodes are electrically interconnected, each light-emitting unit receives a same voltage, allowing each light-emitting unit to emit light for display and exhibit the same light emission brightness; and when the plurality of switches are in a turned-off state, the input signals output by the plurality of input voltage sources are different signals and have different voltages, the plurality of DC voltage electrodes are electrically insulated from each other, the light-emitting units located on each DC voltage electrodes receive a voltage of the input signal different from a voltage of the input signal received by the light-emitting units located on another DC voltage electrode, allowing areas corresponding to the respective DC voltage electrodes to exhibit different light emission brightness.

2. The partitioned display structure as claimed in claim 1, wherein when the plurality of input voltage sources output the same input signals, the voltage of the input signal received by each light-emitting unit is equal to the voltage of the input signal output by each input voltage source.

3. The partitioned display structure as claimed in claim 1, wherein each of the switches is a thin-film transistor, a source terminal and a drain terminal of the thin-film transistor are connected between the two adjacent DC voltage electrodes, respectively, a gate terminal of the thin-film transistor receives an enable signal, and the enable signal is configured to control each of the switches to be in the turned-on state or the turned-off state.

4. The partitioned display structure as claimed in claim 3, wherein in response to the enable signal being a high-level signal, the plurality of switches are in the turned-on state, and in response to the enable signal being a low-level signal, the plurality of switches are in the turned-off state.

5. The partitioned display structure as claimed in claim 1, wherein a brightness of an image outputted using a second voltage as the voltages of the input signals is higher than a brightness of an image outputted using a first voltage as the voltages of the input signals, and wherein the second voltage is greater than the first voltage.

6. The partitioned display structure as claimed in claim 1, wherein each of the light-emitting units comprises:
a light-emitting component, wherein a first terminal of the light-emitting component is connected to the DC voltage electrode correspondingly connected to the light-emitting component;
a first switch, wherein a first terminal of the first switch is connected to a second terminal of the light-emitting component, and a third terminal of the first switch is grounded;
a second switch, wherein a first terminal of the second switch is connected to a data line, a second terminal of the second switch is connected to a scan line, and a third terminal of the second switch is connected to a second terminal of the first switch; and
a storage capacitor, wherein a first terminal of the storage capacitor is connected to the second terminal of the first switch and the third terminal of the second switch, and a second terminal of the storage capacitor is grounded.

7. The partitioned display structure as claimed in claim 6, wherein the light-emitting component is an organic light-emitting diode.

8. The partitioned display structure as claimed in claim 6, wherein the first switch and the second switch are thin-film transistors.

9. A display panel, comprising a partitioned display structure, wherein the partitioned display structure comprises:
a plurality of direct current (DC) voltage electrodes, wherein each of the DC voltage electrodes is connected to a plurality of light-emitting units;
a plurality of input voltage sources, wherein the input voltage sources are connected to the DC voltage electrodes respectively in a one-to-one manner and are configured to transmit input signals to the plurality of light-emitting units for emitting light for displaying images, and each input voltage source transmits the input signals exclusively to a respective corresponding one of the DC voltage electrodes; and
a plurality of switches, wherein each of the switches is connected between two adjacent DC voltage electrodes;
wherein when the plurality of switches are in a turned-on state, the input signals output by the plurality of input voltage sources output are same signals and have a same voltage, the plurality of DC voltage electrodes are electrically interconnected, each light-emitting unit receives the same voltage of the input signal, allowing each light-emitting unit to emit light for display and exhibit the same light emission brightness; and when the plurality of switches are in a turned-off state, the input signals output by the plurality of input voltage sources are different signals and have different voltages, the plurality of DC voltage electrodes are electrically insulated from each other, the light-emitting units located on each DC voltage electrodes receive a voltage of the input signal different from a voltage of the input signal received by the light-emitting units located on another DC voltage electrode, allowing areas corresponding to the respective DC voltage electrodes to exhibit different light emission brightness.

10. The display panel as claimed in claim 9, wherein when the plurality of input voltage sources output the same input signals, the voltage of the input signal received by each light-emitting unit is equal to the voltage of the input signal output by each input voltage source.

11. The display panel as claimed in claim 9, wherein each of the switches is a thin-film transistor, a source terminal and a drain terminal of the thin-film transistor are connected between the two adjacent DC voltage electrodes, respectively, a gate terminal of the thin-film transistor receives an enable signal, and the enable signal is configured to control each of the switches to be in the turned-on state or the turned-off state.

12. The display panel as claimed in claim 11, wherein in response to the enable signal being a high-level signal, the plurality of switches are in the turned-on state, and in response to the enable signal being a low-level signal, the plurality of switches are in the turned-off state.

13. The display panel as claimed in claim 9, wherein a brightness of an image outputted using a second voltage as the voltages of the input signals is higher than a brightness of an image outputted using a first voltage as the voltages of the input signals, and wherein the second voltage is greater than the first voltage.

14. The display panel as claimed in claim 9, wherein each of the light-emitting units comprises:
a light-emitting component, wherein a first terminal of the light-emitting component is connected to the DC voltage electrode correspondingly connected to the light-emitting component;
a first switch, wherein a first terminal of the first switch is connected to a second terminal of the light-emitting component, and a third terminal of the first switch is grounded;
a second switch, wherein a first terminal of the second switch is connected to a data line, a second terminal of the second switch is connected to a scan line, and a third terminal of the second switch is connected to a second terminal of the first switch; and
a storage capacitor, wherein a first terminal of the storage capacitor is connected to the second terminal of the first switch and the third terminal of the second switch, and a second terminal of the storage capacitor is grounded.

15. The display panel as claimed in claim 14, wherein the light-emitting component is an organic light-emitting diode.

16. The display panel as claimed in claim 14, wherein the first switch and the second switch are thin-film transistors.

17. An organic light-emitting diode display panel, comprising a partitioned display structure, wherein the partitioned display structure comprises:
a plurality of direct current (DC) voltage electrodes, disposed spaced apart and arranged in an array with at least two rows and two columns, wherein each of the DC voltage electrodes is connected to a plurality of light-emitting units on the DC voltage electrode;
a plurality of input voltage sources, wherein the input voltage sources are connected to the DC voltage electrodes respectively in a one-to-one manner and are configured to transmit input signals to the plurality of light-emitting units for emitting light for displaying images, and each input voltage source transmits the input signals exclusively to a respective corresponding one of the DC voltage electrodes; and
a plurality of switches, wherein each of the switches is connected between two adjacent DC voltage electrodes;
wherein when the plurality of switches are in a turned-on state, the input signals output by the plurality of input voltage sources output are same signals and have a same voltage, the plurality of DC voltage electrodes are electrically interconnected, each light-emitting unit receives the same voltage of the input signal, allowing each light-emitting unit to emit light for display and exhibit the same light emission brightness; and when the plurality of switches are in a turned-off state, the input signals output by the plurality of input voltage sources are different signals and have different voltages, the plurality of DC voltage electrodes are electrically insulated from each other, the light-emitting units located on each DC voltage electrodes receive a voltage of the input signal different from a voltage of the input signal received by the light-emitting units located on another DC voltage electrode, allowing areas corresponding to the respective DC voltage electrodes to exhibit different light emission brightness.

18. The organic light-emitting diode display panel as claimed in claim 17, wherein when the plurality of input voltage sources output the same input signals, the voltage of the input signal received by each light-emitting unit is equal to the voltage of the input signal output by each input voltage source.

19. The organic light-emitting diode display panel as claimed in claim 17, wherein each of the switches is a thin-film transistor, a source terminal and a drain terminal of the thin-film transistor are connected between the two adjacent DC voltage electrodes, respectively, a gate terminal of thin-film transistor receives an enable signal, and the enable signal is configured to control each of the switches to be in the turned-on state or the turned-off state.

20. The organic light-emitting diode display panel as claimed in claim 17, wherein a brightness of an image outputted using a second voltage as the voltages of the input signals is higher than a brightness of an image outputted using a first voltage as the voltages of the input signals, and wherein the second voltage is greater than the first voltage.

* * * * *